United States Patent [19]
Boskamp et al.

[11] Patent Number: 6,008,649
[45] Date of Patent: Dec. 28, 1999

[54] RF COIL APPARATUS FOR MR SYSTEM WITH LATERAL $B_0$ FIELD

[75] Inventors: Eddy B. Boskamp, Menomonee Falls, Wis.; James Tropp, Berkeley, Calif.

[73] Assignee: General Electric Company, Mikwaukee, Wis.

[21] Appl. No.: 08/997,129

[22] Filed: Dec. 23, 1997

[51] Int. Cl.[6] ................................................. G01V 3/00
[52] U.S. Cl. ................................................ 324/318; 324/322
[58] Field of Search ................................... 324/318, 322, 324/307, 309, 314, 300

[56] References Cited

U.S. PATENT DOCUMENTS

| | | | |
|---|---|---|---|
| 4,928,064 | 5/1990 | Keren | 324/318 |
| 5,153,517 | 10/1992 | Oppelt et al. | 324/318 |
| 5,235,277 | 8/1993 | Wichern | 324/318 |

*Primary Examiner*—Louis Arana
*Attorney, Agent, or Firm*—James O. Skartsen; Christian G. Cabou; Phyllis Y. Price

[57] ABSTRACT

RF coil apparatus is provided for use in an MR imaging system, wherein the $B_0$ field is oriented in a specified direction. The apparatus comprises a coil structure positioned in selected relationship with the $B_0$ field, the coil structure comprising a pair of elongated coil members in spaced-apart parallel relationship, and a selected number of lateral coil members positioned along the elongated coil members in spaced-apart parallel relationship with one another. A number of first capacitive elements, each of a first capacitance, are selectively positioned along the elongated coil members, and a second capacitive element is included in each of the lateral coil members, each of the second capacitive elements being of a second capacitance. A first coupling network operates the coil structure to selectively transmit and receive a first RF field component directed along a first axis which is orthogonal to the $B_0$ field direction, the first RF field having a frequency determined by a specified relationship between the first and second capacitances. In like manner, a second coupling network operates the coil structure to selectively transmit and receive a second RF field component directed along a second axis which is orthogonal to both the $B_0$ field direction and the first axis, the second RF field component having a frequency likewise determined by the relationship between the first and second capacitances, the first and second capacitances being respectively selected so that the frequencies thereof are equal.

17 Claims, 4 Drawing Sheets

RF COIL APPARATUS FOR MR SYSTEM WITH LATERAL $B_0$ FIELD

BACKGROUND OF THE INVENTION

The invention disclosed and claimed herein generally pertains to an RF coil arrangement for use with a magnetic resonance (MR) imaging system in the direction of the $B_0$ field. More particularly, the invention pertains to an RF coil arrangement of the above type which generates I and Q quadrature components to produce a circular polarized RF field within the imaging space. Even more particularly, the invention pertains to an RF coil arrangement which is particularly useful in connection with an MR system of the above type for applications such as spine imaging.

As is well known, in a bore-type full body MR imaging system, a patient is placed within the bore of a cylindrical main magnet. The static or main $B_0$ magnetic field is oriented along the bore axis, and therefore is oriented in a direction extending between the patient's head and feet (hereinafter Superior-Inferior or SI direction). However, in recent years innovators in the MR field have developed and introduced interventional or open magnet MR imaging systems. In such systems the DC or main $B_0$ field is produced by two spaced-apart magnet components. The imaging space, that is, the space in which a patient or other object resides during the imaging procedure, is located between the main magnet components.

In a number of such systems, known as side-entry systems, a patient enters the imaging space by passing between the main magnet components, and then proceeds to sit, lie or stand therebetween. Thus, the main $B_0$ field has a lateral orientation, that is, is oriented from side to side (hereinafter Left-Right or LR direction) with respect to a patient. Moreover, in such arrangements it may be very useful to position the two main magnet components fairly close together. This may be done where the spacing between the two components only needs to accommodate the dimension of a patient taken along the LR or AP direction, and not along a patient's SI direction.

While it is anticipated that open magnets of the above type will provide significant advantages over cylindrical full-body magnets, certain challenges are presented thereby, for applications such as large field-of-view (FOV) spine imaging. In spine imaging, it has been common practice to provide two RF quadrature components, that is, components having a 90° phase difference between them, to generate a circular polarized RF field. This has been done to achieve acceptable SNR or sensitivity in spine imaging. In the past, a butterfly-loop combination coil has typically been employed to generate the RF components. Such combination may comprise separate single loop and butterfly coils, or alternatively may comprise a single resonating coil structure. The single loop produces an RF component orthogonal to the plane of the coil (vertical mode) and the butterfly coil produces an RF component which is parallel to the coil plane (horizontal mode). As is well known, the plane of the circular polarized field generated by the two RF components must be orthogonal to the direction of the $B_0$ field.

A disadvantage of butterfly-loop coils of the prior art is that such coils tend to generate RF fields having bright spots at different locations in the circular polarized plane. This is especially bothersome when $B_0$ is LR and bright spots favor certain vertebrae over others. Bright spots are locations at which RF field intensity is significantly greater than at adjacent surrounding locations. Accordingly, bright spots introduce nonuniformities or inhomogenities into the RF field, between different positions lying in a plane orthogonal to the main $B_0$ field. In previous spine imaging procedures, carried out in association with a bore-type MR imaging arrangement or the like, the RF bright spots generally were not a serious problem. This is because a patient's spine in such imaging arrangement would be directed along the $B_0$ field and would not be affected by RF inhomogenities between different points along a line perpendicular to the $B_0$ field. In fact, it could be advantageous to align the spine with an RF field bright spot, which likewise extended along the $B_0$ field. Now, however, in the open magnet systems described above, spine imaging must be carried out wherein the $B_0$ field is oriented LR with respect to the patient. Thus, the spine lies in the plane of the circular polarized RF field, and acquired spine images could be significantly affected by the bright spots, if a prior art butterfly-loop coil were to be employed to generate the RF field. For example, one or two vertebrae of the spine could coincide with an RF bright spot, while the remaining vertebrae were at very different RF intensities. Accordingly, it is necessary to provide an alternative RF coil structure which can generate a circular polarized RF field, from which the bright spot inhomogenities of the prior art are eliminated.

SUMMARY OF THE INVENTION

The invention generally provides RF coil apparatus for use in an MR imaging system. The RF coil is positioned in selected relationship with the $B_0$ field, and comprises a ladder network, which includes a pair of elongated coil members in spaced-apart parallel relationship, and further includes a selected number of lateral coil members, positioned along the elongated coil members in spaced-apart parallel relationship with one another. Each of the lateral coil members is electrically coupled to both of the elongated coil members, to form the ladder network, or coil structure. The RF coil apparatus further comprises means for applying a first excitation signal to the ladder network to generate a first RF magnetic field, directed along a first axis which is orthogonal to the $B_0$ field. Further means are provided for applying a second excitation signal to the ladder network, to generate a second RF magnetic field directed along a second axis in orthogonal relationship to both the $B_0$ field and the first axis. A number of first capacitive elements, each of a capacitance $C_H$, are selectively distributed along the elongated coil members. A second capacitive element is coupled into each of the lateral coil members, each of capacitance $C_L$. The frequencies of the first and second RF fields depend upon the capacitances of $C_L$ and $C_H$, and more particularly upon the ratio $C_L/C_H$. In accordance with the invention, $C_L$ and $C_H$ are respectively selected so that the frequencies of the first and second RF fields are equal. Means are also included to provide a 90° phase shift between the first and second RF fields. Accordingly, the two fields comprise I and Q quadrature field components, which collectively produce a circular polarized RF magnetic field for the MR imaging system.

In a preferred embodiment of the invention, the lateral coil members are respectively aligned in parallel relationship with the direction of the $B_0$ magnetic field, and the elongated members are perpendicular thereto. Each of the elongated coil members comprises a number of conductive segments, which are connected together through corresponding first capacitive elements in linear relationship. Each of the lateral coil members comprises a pair of lateral conductive segments, each pair being joined together through the corresponding second capacitive element in linear relationship.

In one embodiment of the invention, the means for applying the first and second excitation signals comprise first and second capacitive coupling networks, respectively. In another embodiment, one or both of the excitation signals is inductively coupled to the ladder network. It is anticipated that an embodiment of the invention could be usefully employed in association with an MR imaging system to provide large FOV spine images, wherein the MR system has a lateral $B_0$ field, that is, the $B_0$ field is LR with respect to a patient in the direction of the system $B_0$ magnetic field. However, the invention is by no means limited to such application.

OBJECTS OF THE INVENTION

An object of the invention is to provide an improved RF quadrature coil for MR imaging.

Another object is to provide an RF coil of the above type for imaging elongated structure, such as a patient's spine, which lies in a plane orthogonal to the $B_0$ field of an associated MR imaging system.

Another object is to provide an RF coil of the above type which significantly improves RF field homogeneity, and eliminates or significantly reduces bright spots in the RF field in a plane orthogonal to the $B_0$ field.

Another object is to generate a circular polarized RF field in a plane perpendicular to the $B_0$ field.

Another object is to provide an RF coil of the above type for applications such as large FOV spine imaging.

Another object is to provide an RF coil of the above type which is disposed for use in connection with an open magnet or interventional MR system, wherein the system $B_0$ field is LR with respect to a patient.

These and other objects of the invention will become more readily apparent from the ensuing specification, taken together with the accompanying drawings.

DETAILED DESCRIPTION OF THE PREFERRED EMBODIMENT

Figure 1:
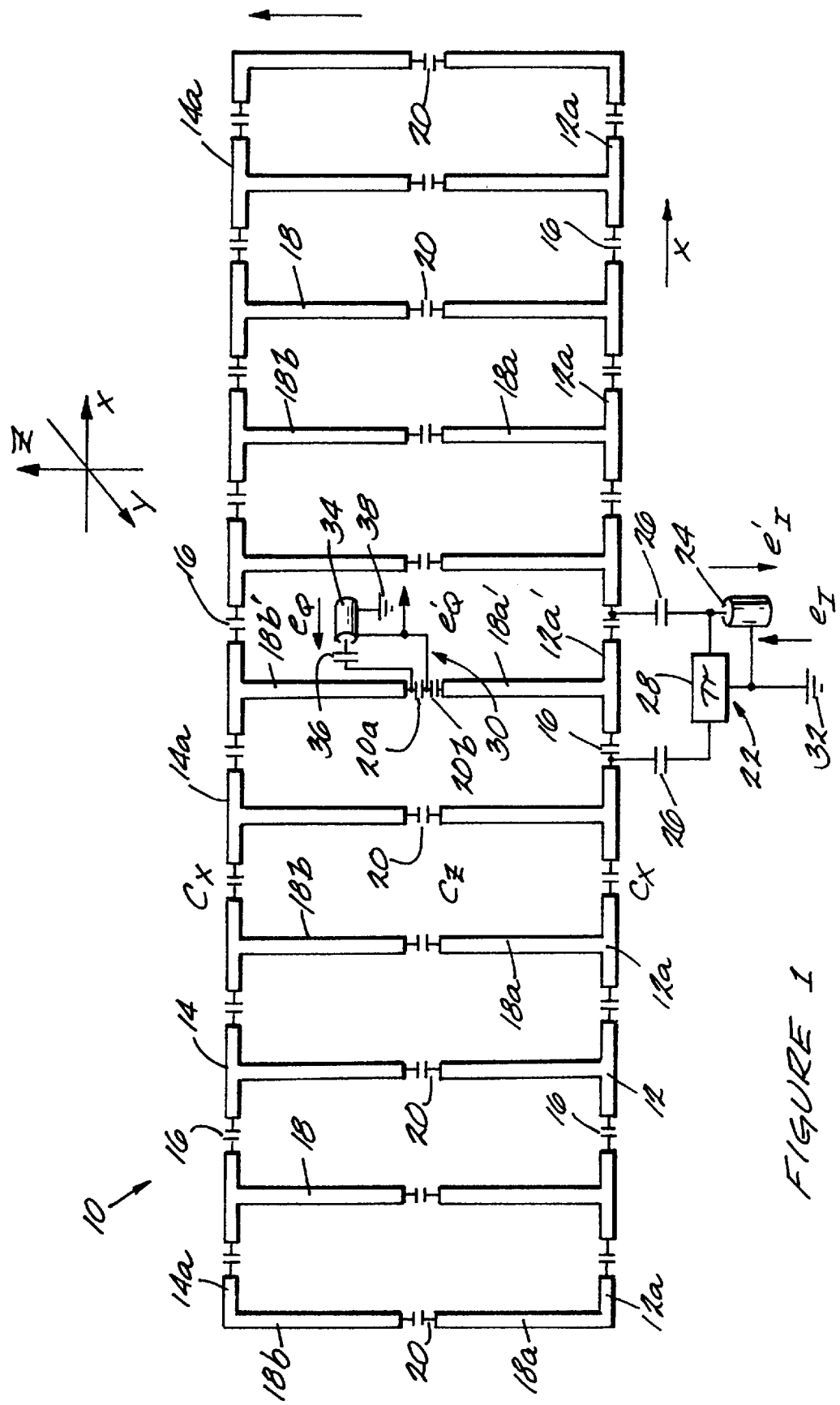
FIG. 1 is a schematic view showing an embodiment of the invention.

Referring to FIG. 1, there is shown RF coil structure 10 constructed in accordance with the invention. Coil 10 comprises two linear elongated coil members 12 and 14, which are in spaced-apart parallel relationship with each other and extend along the X-axis of a set of rectangular coordinates associated with an MR imaging system. Elongated coil member 12 comprises a number of linear conductive segments 12*a*, which are connected together in linear relationship, i.e., so that they lie along a line parallel to the X-axis, by means of capacitors 16. Similarly, elongated coil member 14 comprises a number of linear conductive segments 14*a*, which are likewise connected in linear relationship by capacitors 16. Each capacitor 16 has a capacitance $C_H$.

FIG. 1 further shows RF coil 10 comprising a number of lateral coil members 18, each comprising two lateral conductive segments 18*a* and 18*b*, which are joined together in linear relationship through a capacitor 20 having a capacitance $C_L$. Lateral coil members 18 are positioned along elongated coil members 12 and 14 in equally spaced parallel relationship with each other, and in parallel relationship with the coordinate system Z-axis. Each lateral conductive segment 18*a* and 18*b* is electrically coupled to a conductive segment 12*a* and 14*a*, respectively, to form coil structure 10 as a ladder network. It will be seen that coil structure 10 comprises an odd number of lateral coil members 18.

Referring further to FIG. 1, there is shown a capacitive coupling network 22 coupled to coil structure 10, to apply a coil excitation signal $e_I$ thereto from a coaxial connector 24, when the RF coil 10 is operated in a transmit mode. Network 22 is also available to couple received MR signal components $e'_I$ from coil 10 to connector 24, when coil 10 is operated in a receive mode, as described hereinafter in further detail. FIG. 1 shows network 22 coupled across the two capacitors 16 which are respectively connected to the center-most linear conductive segment 12*a'*. Network 22 is provided with capacitors 26 which respectively match the whole coil structure loaded with a patient to 50 Ohms at this mode. The network 22 also includes a 180° phase shifter 28, for purposes described hereinafter, which is coupled across the capacitors 26 and to a ground 32. The outer conductor of coaxial connector 24 is also connected to ground 32.

FIG. 1 further shows a capacitive coupling network 30 coupled across a capacitor 20*a*, which together with a capacitor 20*b* connected thereto provides the capacitance $C_L$ between lateral conductive segments 18*a'* and 18*b'*, the conductive segments of the center-most lateral coil member 18. Network 30 is disposed to couple a coil excitation signal $e_Q$ to capacitor 20*a* from a coaxial connector 34, when the RF coil 10 is operated in a transmit mode. Network 30 is also available to couple received MR signal components $e_Q'$ from coil 10 to coaxial connector 34, when coil 10 is operated in a receive mode. Network 30 is provided with a capacitor 36 which matches the whole structure loaded with a patient to 50 Ohms for this mode. Coaxial connector 34 is coupled to a ground 38, which must remain isolated from ground 32 coupled to network 22. It will be seen from FIG. 1 that networks 22 and 30 are both symmetrically coupled with respect to the center-most lateral coil member 18 of coil structure 10.

By producing signals $e_I$ and $e_Q$ so that there is a 900 phase difference between them, they respectively operate coil 10 to genate RF field components which are likewise 90° out of phase, and oriented along the Y- and X-axes, respectively. Such field components can thus serve as the I and Q quadrature components, respectively, for a circular polarized RF signal. Moreover, the received signals $e'_I$ and $e'_Q$ will be induced in the coil 10 by respective I and Q RF components, and accordingly will be 90° out of phase. It will be noted that the 180° phase shifter 28 is provided to insure isolation between signals $e_I$ and $e_Q$, and also between signals $e'_I$ and $e'_Q$.

For a better homogeneity in the SI direction, more conductors are needed in the LR direction, which generate RF magnetic fields perpendicular to the $B_0$ magnetic field. Thus, coil 10, shown in FIG. 1 as a ladder network, or flat bandpass birdcage, can be thought of as an open piece of transmission line. In a first or base mode (mode 1) coil 10 can contain half a wavelength corresponding to a current density pattern in conductors 18a and 18b that resembles that of a single loop. For an infinite number of conductors 18a and 18b the current density pattern equals that of a half wavelength sine. The signals $e_I$ and $e'_I$ are associated with mode 1. The next higher mode (mode 2) will set up a current density distribution in conductors 18a and 18b that resembles a full wavelength sine and thus a butterfly pattern. The signals $e_Q$ and $e'_Q$ are associated with mode 2. In the case of the flat birdcage, the two modes of interest, i.e., modes 1 and 2, will happen at the same frequency, for a certain ratio $C_L/C_H$.

More specifically, the frequencies of mode 1 and mode 2 operation of RF coil 10 can be made equal by means of the following expression:

$$\omega_J^2 = \frac{2\omega_a^2\{1 + C_L/C_H - \cos[\pi J(N+1)]\}}{1 - 2\xi\cos[\pi J/(N+1)]} \qquad \text{Eqn. (1)}$$

where J is the mode index, $\omega_a\sqrt{2}$ is the equivalent low pass single mesh frequency (obtained by shorting the capacitor $C_H$), $C_L/C_H$ is the ratio of the low pass to high pass capacitance, and $\xi$ is a coefficient of magnetic coupling between neighboring cells. N is the number of cells in the ladder, N being ten for coil 10 shown in FIG. 1. It will be readily apparent that Eqn. (1) may be used to compute a ratio $C_L/C_H$ such that mode 1 frequency $\omega_1$ will be equal to mode 2 frequency $\omega_2$. Respective capacitances $C_L$ and $C_H$ are selected to provide such ratio. The general condition of equality of mode frequencies 1 and 2 is in fact a specific instance of a more general equality (or degeneracy, to use the term of art) among the frequencies of the several resonant modes of the coil. This degeneracy is exact within limits of the existing circuit model, which utilizes a single coefficient of magnetic coupling; but for a model in which additional coefficients proved to be significant, further refinements of the circuit might be needed to produce the desired degeneracy, for instance the introduction of capacitors joining alternate meshes of the ladder network. Variations on this theme may be envisioned by those skilled in the art, and it is therefore to be emphasized that the key to the present invention lies not only in a specific means of producing degeneracy of a desired pair of modes, but rather the general principle that ladder networks (and other flat networks) may be designed to have degenerate resonant modes, utilizable for the purposes outlined hereinabove.

Figure 2:
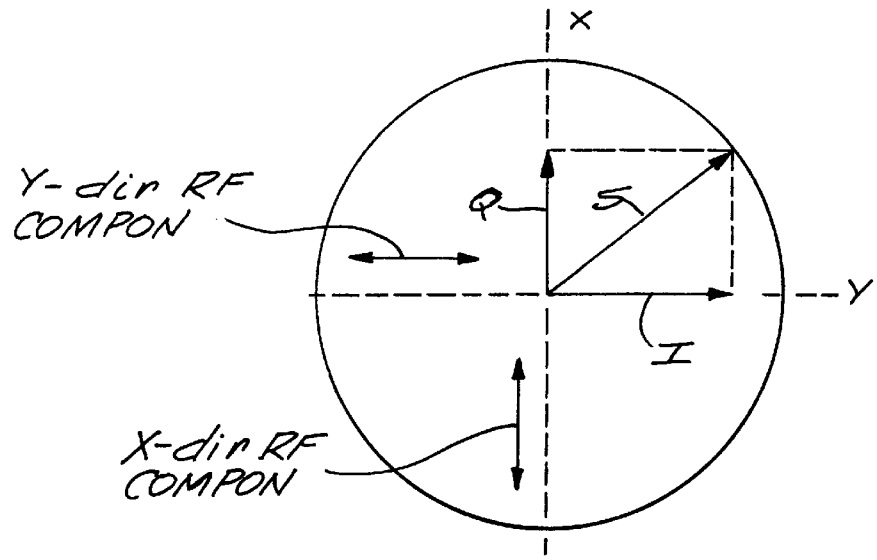
FIG. 2 is a diagram illustrating circular polarization in connection with the RF field produced by the embodiment of FIG. 1.

Referring to FIG. 2, there are shown quadrature RF components I and Q, comprising mode 1 and mode 2 signals and sinusoidally varying in relation to the Y- and X-axes, respectively. As they vary, the components provide a resultant circular polarized RF magnetic field S. It has been found that such quadrature field pattern, generated in accordance with Eqn. (1), is highly homogeneous in the spine direction.

Figure 3:
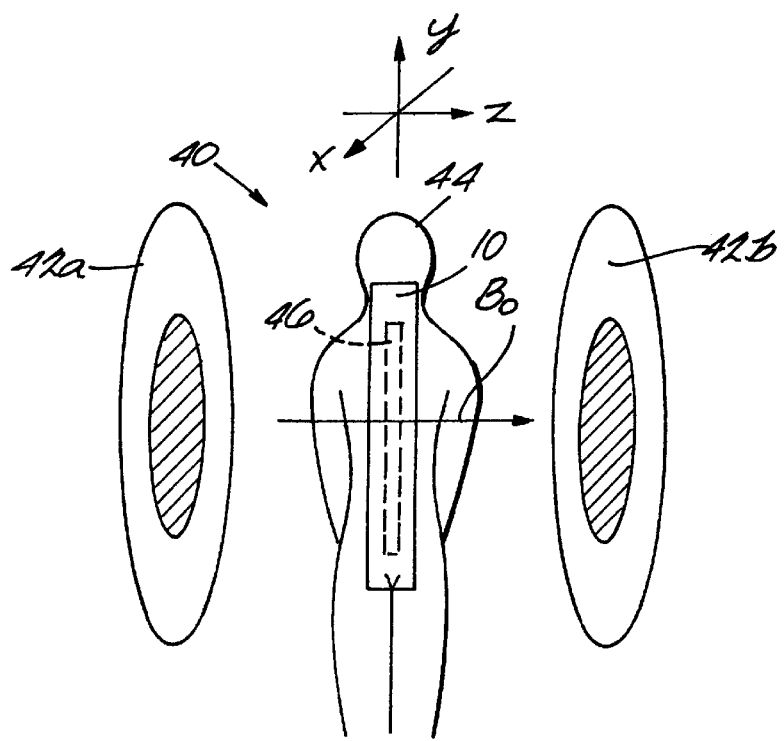
FIG. 3 is a simplified perspective view showing the embodiment of FIG. 1 used with an MR system having a lateral or LR $B_0$ field.

Referring to FIG. 3, there is shown a lateral $B_0$ field open magnet MR system 40. System 40 is provided with closely spaced magnet components 42a and 42b, and a patient 44 is positioned to sit or stand between them. The static $B_0$ field, directed along the Z-axis and LR with respect to patient 44, is generated by magnets 42a and 42b. Coil 10 is included in system 40 to generate a circular polarized RF field in the X-Y plane, orthogonal to the $B_0$ field to provide the $B_1$ field.

The arrangement shown in FIG. 3 may usefully be employed for imaging the spine 46 of a patient 44, the spine being aligned in the X-Y plane. It will be noted that the capacitances $C_H$ and $C_L$ of coil 10 may be selected to provide an RF frequency matching the Larmor frequency for MR imaging, as well as to make the frequencies for the orthogonal modes 1 and 2 equal to each other.

Figure 4:
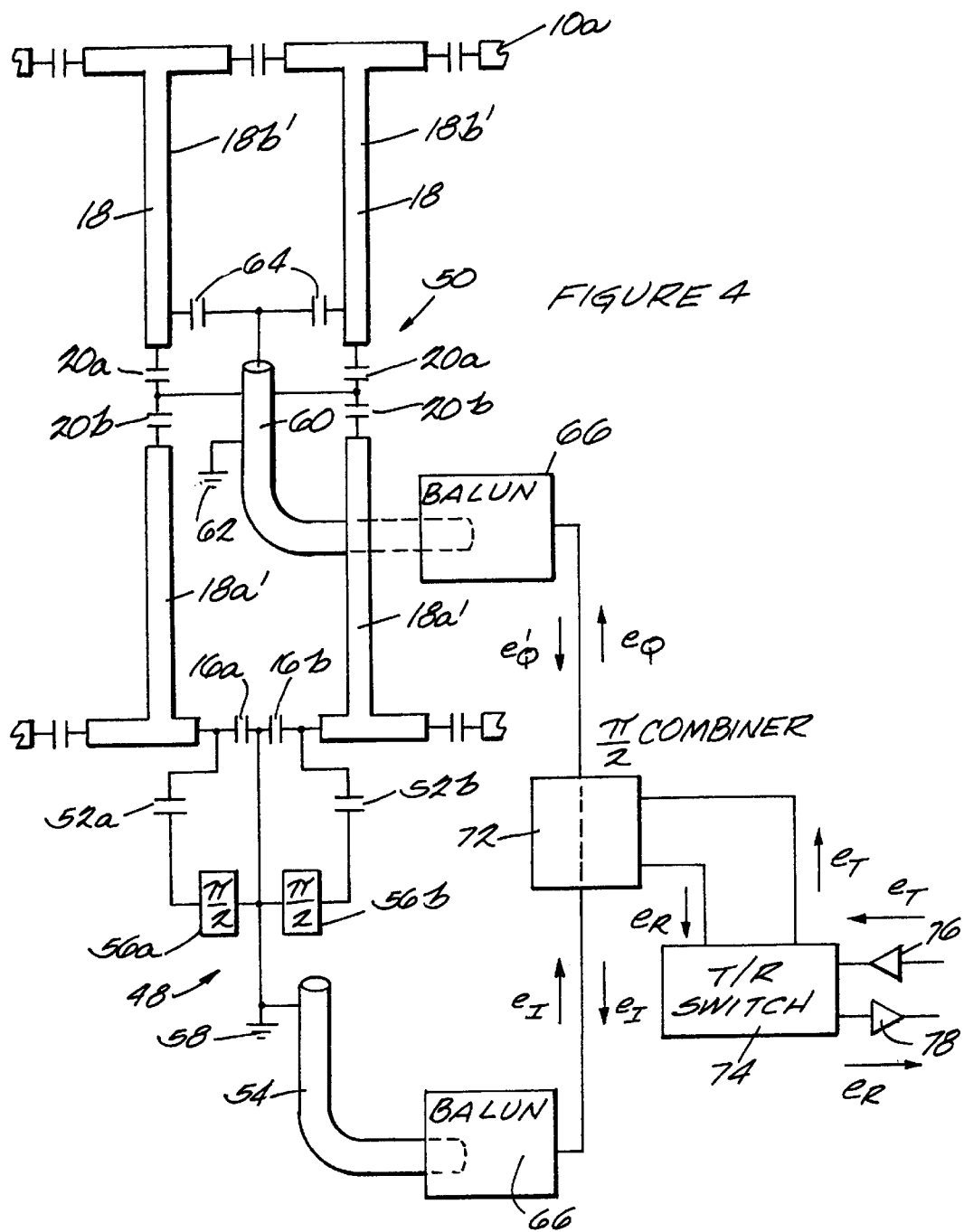
FIG. 4 shows a coupling arrangement for operating a second embodiment of the invention.

Referring to FIG. 4, there is shown a portion of a coil 10a which is substantially identical to coil 10, except that it has an even number of lateral coil members 18, such as 12, rather than an odd number thereof. Thus, such coil includes two center-most lateral coil members 18, each comprising lateral conductive segments 18a' and 18b', instead of one center-most member as shown in coil 10. It will be understood that in the partially depicted coil 10a, there are an equal number of lateral coil members 18 to the left and to the right of the two central members 18 shown in FIG. 4. Accordingly, to maintain symmetry, capacitive coupling networks 48 and 50, respectively provided to operate coil 10a, must both be coupled between the two central members 18 thereof.

Referring further to FIG. 4, there is shown coupling network 48 including capacitors 52a and 52b, which respectively match the coil 10 structure of mode 1 to 50 Ohms between the central lateral coil members 18. The capacitances of capacitors 16a and 16b cumulatively provide a capacitance $C_H$. Matching capacitor 52b is coupled directly to the inner conductor of a coaxial cable 54, and capacitor 52a is coupled thereto through two 90° phase shifters 56a and 56b. The phase shifters serve to isolate signal $e_I$ from $e_Q$, as described above. FIG. 4 further shows network 50 provided with capacitors 64, each matching the coil structure of mode 2 to 50 Ohms.

Figure 5:
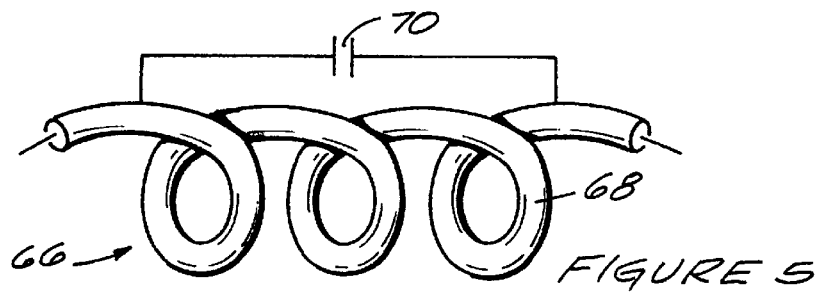
FIG. 5 is a schematic view showing a balance/unbalance network for the embodiment of FIG. 4.

To eliminate standing waves induced on the shields of coaxial cables 54 and 60, balance/unbalance networks (baluns) 66 are respectively coupled thereto. Referring to FIG. 5, there is shown a balun 66 comprising a length of coaxial cable 68, with a capacitor 70 connected across the ends thereof, to provide a high-impedance shielded transmission path. Baluns 66 serve to isolate the grounds associated with the shields of cables 54 and 60 from one another. This is very important, since the grounds of the two modes are not common.

It is anticipated that the coil 10 or 10a will most typically be used as a receive-only coil. In such arrangement the RF body coil would be used for excitation. Moreover, there would be no transmit/receive switch, since it would not be necessary to place the coil in a transmit mode. Accordingly, it would be necessary to provide coil 10 or 10a with conventional decoupling networks (not shown) to insure that such coil was decoupled from the transmit coil during the transmit phase of the imaging sequence.

In an alternative arrangement, coil 10 or 10a could be used to transmit as well as to receive I and Q RF field components. Such arrangement is shown in FIG. 4, wherein coaxial cables 54 and 60 are disposed to receive I- and Q-channel excitation signals $e_I$ and $e_Q$, respectively. The excitation signals are supplied by a 90° combiner network 72, when a transmit/receive (T/R) switch 74 coupled thereto is in a transmit mode. More specifically, during an MR pulse sequence of the associated MR system, a transmit amplifier 76 provides an RF signal $e_T$. Synchronously therewith, the T/R switch 74 is operated to couple the RF signal to combiner network 72, and therethrough to the coaxial cable 54 and coupling network 48, as excitation signal $e_I$. At the same time, coupling network 72 delays the signal $e_T$ by 90°, to provide the excitation signal $e_Q$ which is coupled to coaxial cable 60 and coupling network 50. Thus, cable 54 and network 48 comprise the I-channel, and cable 60 and network 50 comprise the Q-channel.

During the acquisition phase of the MR pulse sequence, received MR signal components $e'_I$ and $e'_Q$ are detected by the same components of the RF coil of the invention, respectively, which produce the Y-direction and X-direction RF excitation components, as described above. The detected $e'_I$ and $e'_Q$ signals are coupled back to combiner network 72 through coaxial cables 54 and 60, respectively. Combiner network 72 operates on the $e'_I$ and $e'_Q$ signals to produce a resultant received MR signal $e_R$ therefrom, which is coupled to T/R switch 74. During such acquisition phase, switch 74 is operated to couple the MR signal $e_R$ to receive amplifier 78.

Figure 6:
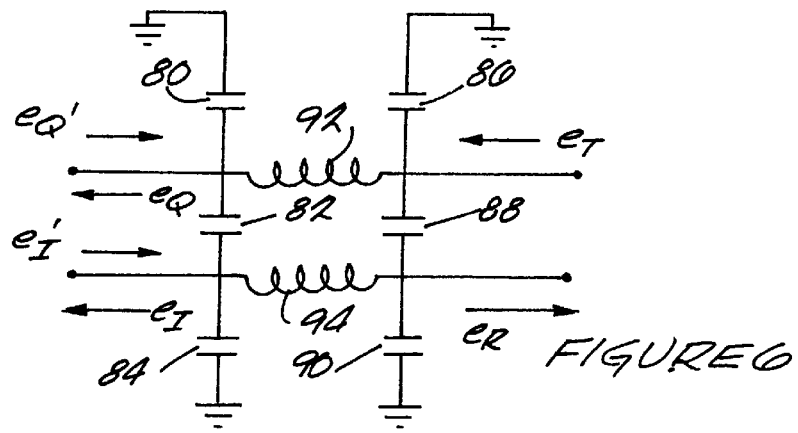
FIG. 6 is a schematic view showing a combiner network for the embodiments of FIGS. 1 and 4.

Combiner network 72 comprises a conventional device, an example of which is shown in FIG. 6. Capacitive elements 80–90 thereof are respectively connected to inductive elements 92 and 94, as shown.

Figure 7:
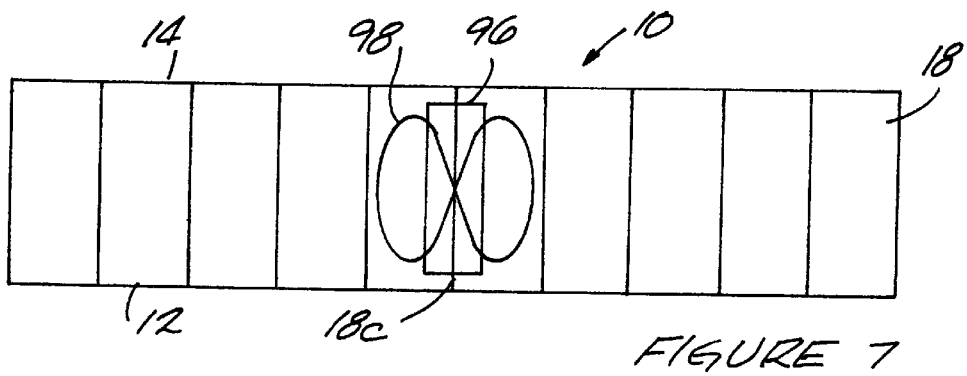
FIG. 7 is a simplified view showing an inductive coupling arrangement for an embodiment of the invention having an odd number of lateral coil members.

Referring to FIG. 7, there is shown a coil constructed in accordance with the invention, such as coil 10, having an odd number of lateral coil members 18. However, in FIG. 7 an inductive coupling arrangement, rather than the capacitive arrangement described above, is employed to couple RF quadrature signal components to and from the coil. I-channel components are inductively transmitted and received by means of a single loop coil 96, whereas Q-channel components are transmitted and received by means of a butterfly coil 98. Coils 96 and 98 are both symmetrically positioned with respect to the center-most lateral coil member 18c of the coil 10 shown in FIG. 7. The centering of inductive coils 96 and 98 insures isolation between them.

Figure 8:
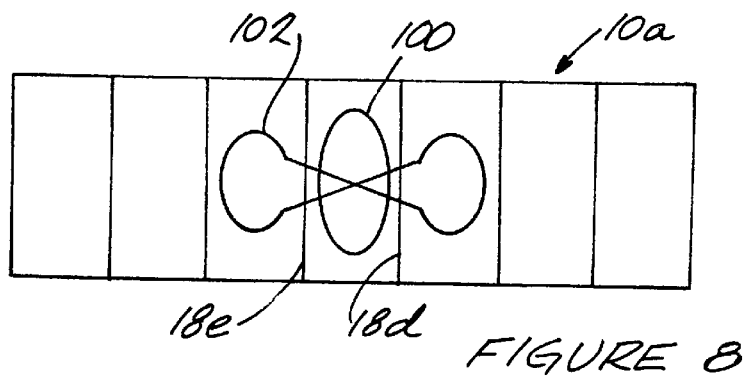
FIG. 8 is a simplified view showing an inductive coupling arrangement for an embodiment of the invention having an even number of lateral coil members.

Referring to FIG. 8, there is shown an inductive coupling arrangement for a coil such as 10a, i.e., an RF coil of the invention having an even number of lateral coil members 18. Such coil includes two central coil members, represented in FIG. 8 as members 18d and 18e, respectively. The inductive coupling arrangement of FIG. 8 comprises a single loop coil 100 and a butterfly coil 102, wherein both coils 100 and 102 are symmetrically positioned with respect to central lateral coil members 18d and 18e. In like manner with the arrangement of FIG. 7, use of centered inductive coils 100 and 102 insures isolation between the two modes of coil operation.

It will be readily apparent that a combined coupling arrangement could be used with respect to coil 10. For example, the I-channel component could be inductively coupled to coil 10, and the Q-channel could be capacitively coupled thereto. Such arrangement would likewise achieve good isolation between modes 1 and 2.

Obviously, many other modifications and variations of the present invention are possible in light of the above teachings. It is therefore to be understood that within the scope of the disclosed concept, the invention may be practiced otherwise than has been described.

What is claimed is:

1. RF coil apparatus for use in an MR imaging system, wherein the $B_0$ magnetic field of the system is oriented in a specified direction, said RF coil apparatus comprising:

a coil structure comprising a pair of elongated coil members in spaced-apart parallel relationship and further comprising a selected number of lateral coil members positioned along said elongated coil members in spaced-apart parallel relationship with one another, each lateral coil member coupled to both of said elongated coil members to form said coil structure, each of said lateral coil members respectively being aligned in parallel relationship with the direction of said $B_0$ magnetic field so that said coil structure lies in a coil plane which is likewise aligned in parallel relationship with the direction of said $B_0$ magnetic field, said coil plane comprising a hypothetical plane intersecting each of said elongated and lateral coil members of said coil structure; and a number of first capacitive elements, each having a first capacitance, selectively positioned with respect to said elongated coil members;

a number of second capacitive elements, each having a second capacitance, selectively positioned with respect to said lateral coil members;

first coupling means for operating said coil structure to selectively transmit and receive a first RF field component directed along a first axis which is orthogonal to said $B_0$ field direction; and second coupling means for operating said coil structure to selectively transmit and receive a second RF field component directed along a second axis which is orthogonal to both said $B_0$ field direction and said first axis, the frequencies of said first and second RF field components being equal to the same specified frequency.

2. The apparatus of claim 1 wherein:

said first coupling means comprises means for operating each coil member of said coil structure and each of said first and second capacitive elements, collectively, in a single loop coil mode to transmit and receive said first RF field component; and said second coupling means comprises means for operating each coil member of said coil structure and each of said first and second capacitive elements, collectively, in a butterfly coil mode to transmit and receive said second RF field component.

3. The apparatus of claim 2 wherein:

said first and second RF field components comprise quadrature magnetic field components which collectively produce a circular polarized RF magnetic field for said imaging system, said RF magnetic field lying in a plane which is in orthogonal relationship to said coil plane of said coil structure.

4. The apparatus of claim 3 wherein:

said specified frequency is determined by the ratio of said second capacitance to said first capacitance.

5. The apparatus of claim 3 wherein:

said RF magnetic field has a level of homogeneity which is related to the number of said lateral coil members of said coil structure, so that said homogeneity increases as said number of lateral coil members is increased.

6. The apparatus of claim 5 wherein:

said first and second coupling means comprise first and second capacitive coupling networks, respectively, each provided with a ground connection; and said apparatus includes means for maintaining isolation between said ground connections.

7. The apparatus of claim 5 wherein a human subject is positioned with respect to said imaging system to define LR and SI directions therein, said LR direction being parallel to the direction of said $B_0$ magnetic field, and said SI direction being orthogonal thereto, and wherein:

said elongated members are aligned in orthogonal relationship with each of said lateral coil members, and are aligned in parallel relationship with said SI direction, so that said coil plane of said coil structure is aligned in parallel relationship with axes extending in both said LR and SI directions.

8. The apparatus of claim 2 wherein:

said network structure comprises a ladder network.

9. The apparatus of claim 8 wherein:

said coil structure comprises an odd number of said lateral coil members, one of said lateral members comprising a center-most member; and each of said coupling means is coupled to said center-most member.

10. The apparatus of claim 8 wherein:

said coil structure comprises an even number of said lateral coil members, two of said lateral members comprising center-most members; and each of said coupling means is coupled between said center-most members.

11. An RF coil apparatus for use in an MR imaging system, wherein the $B_0$ magnetic field of the system is directed along a specified $B_0$ axis, said apparatus comprising:

a selected number of inductive elements;

a selected number of capacitors selectively coupled to said inductive elements to form a flat network, said network being aligned so that a hypothetical plane extending in parallel relationship with said $B_0$ axis intersects each of said inductive elements and capacitors; and means for coupling said network to specified circuit components associated with an MR system in order to operate said network to produce a pair of degenerate resonant modes, both of said degenerate modes having the same resonant frequency, and to further operate said network in transmit and receive modes, selectively, said degenerate modes, when said network is operated in said transmit mode, each producing an RF magnetic field, said RF fields being orthogonal to each other in some region of space and collectively producing a circularly polarized RF field for exciting an MR signal, and said degenerate modes, when said network is operated in said receive mode, being disposed to receive an MR signal.

12. The apparatus of claim 11 wherein:

said inductive elements are disposed to form a ladder structure comprising a pair of elongated coil members in spaced-apart parallel relationship, and a number of lateral coil members positioned along said coil members in spaced-apart relationship and coupled therebetween each of said lateral coil members being aligned in parallel relationship with said $B_0$ axis, and each of said elongated coil members being aligned in orthogonal relationship with said $B_0$ axis.

13. The apparatus of claim 11 wherein:

said inductive elements are disposed to form an array of closed loops which are separate and distinct from each other, gaps being provided at selected locations in said loops; and one of said capacitors is placed in each of said gaps.

14. The apparatus of claim 11 wherein:

said coupling means comprises two coupling networks, each of said coupling networks being coupled to one of said degenerate modes.

15. The apparatus of claim 14 wherein:

each of said coupling networks comprises a capacitive coupling network.

16. The apparatus of claim 14 wherein:

each of said coupling networks comprises an inductive coupling network.

17. The apparatus of claim 14 wherein:

one of said coupling networks comprises a capacitive network, and the other of said coupling networks comprises an inductive network.

* * * * *